US008680951B2

(12) United States Patent
Steeneken

(10) Patent No.: US 8,680,951 B2
(45) Date of Patent: Mar. 25, 2014

(54) MEMS RESONATOR

(75) Inventor: Peter G. Steeneken, Valkensward (NL)

(73) Assignee: NXP, B.V., Eindhoven (NL)

( * ) Notice: Subject to any disclaimer, the term of this patent is extended or adjusted under 35 U.S.C. 154(b) by 437 days.

(21) Appl. No.: 12/993,486

(22) PCT Filed: May 8, 2009

(86) PCT No.: PCT/IB2009/051904
§ 371 (c)(1),
(2), (4) Date: Nov. 19, 2010

(87) PCT Pub. No.: WO2009/141750
PCT Pub. Date: Nov. 26, 2009

(65) Prior Publication Data
US 2011/0063052 A1   Mar. 17, 2011

(30) Foreign Application Priority Data
May 19, 2008 (EP) .................... 08104020

(51) Int. Cl.
*H03H 9/00* (2006.01)
*H01P 7/00* (2006.01)

(52) U.S. Cl.
USPC .......................................... 333/186; 333/219

(58) Field of Classification Search
USPC .......... 333/186, 197, 198, 199, 219; 310/309, 310/367, 368, 369
See application file for complete search history.

(56) References Cited

U.S. PATENT DOCUMENTS

| 7,205,867 B2 * | 4/2007 | Lutz et al. ..................... 333/186 |
| 7,295,088 B2 * | 11/2007 | Nguyen et al. ................ 333/186 |
| 8,269,578 B2 | 9/2012 | Phan Le et al. |
| 2002/0105393 A1 | 8/2002 | Clark et al. |
| 2005/0151442 A1 | 7/2005 | Kihara et al. |
| 2005/0174197 A1 | 8/2005 | Nguyen et al. |

OTHER PUBLICATIONS

Auld, B. A., "Acoustic Fields and Waves in Solids," vol. I, Chapter 7, John Wiley & Sons, Inc., title page, copyright page, pp. 191-236 (1973).
Clark, J., et al "UHF High-Order Radial-Contour-Mode Disk Resonators," Proc. of the 2003 IEEE Int'l. Frequency Control Symp. and PDA Exhibition, pp. 802-809 (2003).
Kaajakari, V., et al, "Square-Extensional Mode Single-Crystal Silicon Micromechanical Resonator for Low-Phase-Noise Oscillator Applications," IEEE Electron Device Letters, vol. 25, No. 4, pp. 173-175 (Apr. 2004).
Kaajakari, V., et al "Nonlinear Limits for Single-Crystal Silicon Microresonators", J. of Microelectromechanical Systems, vol. 13, No. 5, pp. 715-724 (Oct. 2004).
Hao, Z., et al, "VHF Single-Crystal Silicon Elliptic Bulk-Mode Capacitive Disk Resonators—Part I: Design and Modeling", J. of Microelectromechanical Systems, vol. 13, No. 6, pgs. 1043-1053 (Dec. 2004).

(Continued)

*Primary Examiner* — Dean O Takaoka

(57) ABSTRACT

A micro-electromechanical resonator comprising a material having anisotropic directional elasticity characteristics. A shape of the resonator is such that a first distance in a first direction from a centroid of the resonator to a first point on a peripheral edge of the resonator is greater than a second distance in a second direction from the centroid to a second different point on the edge. This is true for every first direction and every second direction wherein the material has a lesser modulus of elasticity in the first direction than the second direction.

15 Claims, 8 Drawing Sheets

(56) References Cited

OTHER PUBLICATIONS

Pourkamali, S., et al, "VHF Single-Crystal Silicon Capacitive Elliptic Bulk-Mode Disk Resonators—Part II: Implementation and Characterization," J. of Microelectromechanical Sys., vol. 13, No. 6, pp. 1054-1062 (Dec. 2004).

Wang, J., et al, "1.156-GHz Self-Aligned Vibrating Micromechanical Disk Resonator," IEEE Trans. on Ultrasonics, Ferroelectrics, and Frequency Control, vol. 51, No. 12, pp. 1607-1628 (Dec. 2004).

Torres, F., et al, "Nanometer Scale Gaps for Capacitive Transduction Improvement on RF-MEMS Resonators," Microelectronic Engineering 84, pp. 1384-1387 (Jan. 30, 2007).

International Search Report and Written Opinion for int'l. patent appln. No. PCT/IB2009/051904 (Aug. 28, 2009).

Deng, K., et al, "Piezoelectric Disk Resonators Based on Epitaxial AlGaAs Films," J. of Microelectromechanical Systems, vol. 16, No. 1, pp. 155-162 (Feb. 2007).

J. Wang, J. E. Butler, T. Feygelson, and C. T.-C. Nguyen, "1.51-GHz polydiamond micromechanical disk resonator with impedance-mismatched isolating support," Proceedings, 17th Int. IEEE Micro Electro Mechanical Systems Conf., Maastricht, The Netherlands, Jan. 25-29, 2004, pp. 641-644.

\* cited by examiner

MEMS RESONATOR

This invention relates to micro-electromechanical systems (MEMS). More particularly, it relates to MEMS resonator devices.

MEMS resonators allow the integration of accurate timing and frequency reference devices on a silicon chip. This allows major cost and size reductions compared, for example, to conventional quartz oscillator circuits. Two existing designs for making a MEMS resonator are the square-extensional and the disk resonator. The most interesting resonance modes in these resonators are the extensional, or longitudinal, modes. These modes are favourable because they can store more energy than most flexural modes, and are therefore less susceptible to non-linearity.

Extensional-mode—also known as planar-mode—vibration consists of a compression wave in the plane of the material. That is, the physical displacement of the material takes place in directions lying in the same plane as the resonator, alternately stretching and compressing the material. There is little or no displacement (that is, bending or flexion) in the direction transverse to the plane. It is difficult to characterize extensional resonance mode in general, however a first property is that most of the strain energy is stored in extending or compressing the resonator dimensions along its axes, which usually changes the area of its cross-section. This is contrary to bending-mode resonators where most of the energy is stored in shearing or bending deformations.

The extensional modes can be approximated by a superposition of (quasi-)longitudinal acoustic waves, which form a standing wave. In a square-extensional resonator, for example, the standing wave has wavelength λ related to the size L of the side of the square structure by $L=(n+\frac{1}{2})\lambda$, where n is an integer. The resonance frequency w of extensional resonators is usually proportional to the acoustic velocity divided by the wavelength λ.

$$\omega \propto V_{acoustic}/\lambda \qquad \text{(equation 1)}$$

However when the acoustic velocity is anisotropic the exact calculation is difficult and can require numerical approximations.

In a typical MEMS resonator, the mechanical vibration is excited by electrostatic forces resulting from an electrical signal applied via one or more electrodes spaced a small distance apart from the resonator. The vibration gives rise to a changing capacitance, which can be detected either via a separate output electrode (or electrodes) or via the body of the resonator itself. It can also be detected by piezoresistive sensing or optical means. When the input signal is at or near the resonant frequency of the device, resonance occurs, effectively amplifying the output signal at this frequency by the gain factor Q of the device.

The particular mode of resonance is determined, along with the frequency of vibration, by the properties of the material from which the resonator is constructed and the geometry of the device. In general, as can be seen from the equation above (equation 1), smaller dimensions are associated with higher-frequencies (since frequency is inversely related to wavelength).

More specifically, the dynamics of the compression (acoustic) wave are affected by parameters such as the density and elastic modulus of the material. Elastic modulus is a measure of the resistance of an object or material to elastic (as distinct from plastic, or permanent) deformation when force is applied to it. It is defined as the ratio of stress to strain. Thus, the greater the elastic modulus of a substance, the more force must be applied to stretch or compress it proportionately by a given factor. Hence, a higher elastic modulus means that, for a given applied stress (force), the substance is deformed relatively less than a substance of lower modulus.

As highlighted above, the size of a MEMS resonator is inversely related to resonant frequency. Current sizes are sufficiently small to make Radio-Frequency (RF) resonators realizable using this technology. This makes MEMS technology an exciting prospect for next generation wireless communication devices. However, to prove a viable alternative to conventional resonators, MEMS devices must match or exceed their performance. The devices must resonate in predictable and stable modes and be highly efficient transducers of electrical/mechanical energy.

According to the current invention, there is provided a micro-electromechanical resonator comprising a material having anisotropic directional elasticity characteristics, wherein a shape of the resonator is such that a first distance in a first direction from a centroid of the resonator to a first point on a peripheral edge of the resonator is greater than a second distance in a second direction from the centroid to a second different point on the edge, for every first direction and every second direction wherein the material has a lesser modulus of elasticity in the first direction than the second direction.

Anisotropic materials have been found to have better mechanical properties than isotropic materials. In particular, anisotropic crystalline structures have lower intrinsic energy loss and therefore a higher Q-factor. The inventors have recognised that known MEMS resonators of anisotropic material, and having standard geometries, suffer distortions in their shape in resonant modes, which are detrimental to their performance. By designing the resonator with dimensions in each direction which depend inversely on the modulus of elasticity, the distortion of the shape of the device at resonance is reduced.

Preferably, the shape is adapted in accordance with the directional characteristics to provide resonance in a predetermined extensional resonance mode, the resonance mode producing an elastic deformation of the resonator which displaces the peripheral edge of the resonator, the displacement being substantially uniform at every point along a perimeter around the edge in the direction perpendicular to the edge at each point.

The resonator is therefore constructed of an anisotropic material but formed in a shape which results in preferential selection of a "coherent" extensional mode exhibiting uniform displacement—that is, uniform elastic expansion and contraction—of the perimeter of the device. This means that all points of the perimeter will approach the exciting (input) and measurement (output) electrodes at the same rate. Since capacitance is non-linearly related to this separation distance, this resonance mode improves the linearity of the device. The likelihood of exciting unwanted resonance modes is reduced, because the shape of the resonator is well matched only to the wanted mode. Furthermore, the shape of the electrodes can also be matched to the same shape, since the resonator maintains substantially the same shape (effectively only changing in size) throughout a period of oscillation.

Preferably, the predetermined extensional resonance mode is a quasi-longitudinal mode.

The quasi-longitudinal modes are the principal modes of interest. More complex modes are usually modelled as a superposition of such modes. By selecting a single quasi-longitudinal mode, the design, modelling and analysis of the resonator can be simplified.

Preferably, the shape is proportional to a slowness surface of the material, corresponding to the predetermined quasi-longitudinal extensional resonance mode.

Choosing the shape in accordance with the quasi-longitudinal slowness surface of the anisotropic material offers an analytic solution to the optimisation of geometry.

Preferably, the resonator is supported by a stem attached to the centroid.

Anchoring via the centroid will have minimal impact on resonance shape in the selected coherent mode, since the standing wave will be symmetrical about the centre. Energy loss and non-linearity associated with the attachment of the resonator are therefore avoided. Alternatively, anchoring can be performed using springs.

The resonator can then be biased by a bias voltage applied via the stem.

This reflects one beneficial mode of operation of the MEMS resonator, in which both input and output terminals are comprised of one or more capacitive electrodes.

According to another aspect of the invention, there is provided a micro-electromechanical system comprising: a substrate; an input electrode and an output electrode on the substrate; and the micro-electromechanical resonator described above suspended above the substrate between the input and output electrodes.

Preferably, the input and output electrodes are shaped so as to cooperate with the resonator to form an actuation gap between each electrode and the peripheral edge of the resonator, the gap being of a substantially uniform width at every point around the edge in the direction perpendicular to the edge at each point, the width being sufficient to accommodate the displacement of the edge in the predetermined extensional resonance mode without the electrodes contacting the resonator.

The electrodes are shaped and located such that the gap has the same width all around the perimeter of the resonator. Since the resonator operates in the coherent extensional mode described above, the gap will vary in width as the resonator vibrates, but the changing width will always remain uniform. This provides the overall device with qualities of increased linearity and efficiency. It also further reduces the likelihood of undesired modes being excited by the applied input signals. Furthermore, the in this configuration, the width of the gap can be minimised, which in turn maximises the actuation force and output current and/or voltage.

According to yet another aspect of the invention, there is provided a method of manufacturing a micro-electromechanical resonator, the resonator comprising a material having anisotropic directional elasticity characteristics, the method comprising: selecting a shape of the resonator such that a first distance in a first direction from a centroid of the resonator to a first point on a peripheral edge of the resonator is greater than a second distance in a second direction from the centroid to a second different point on the edge for every first direction and every second direction wherein the material has a lesser modulus of elasticity in the first direction than the second direction; and materially producing the resonator having the selected shape.

The invention will now be described by way of example with reference to the accompanying drawings, in which.

Figure 1:
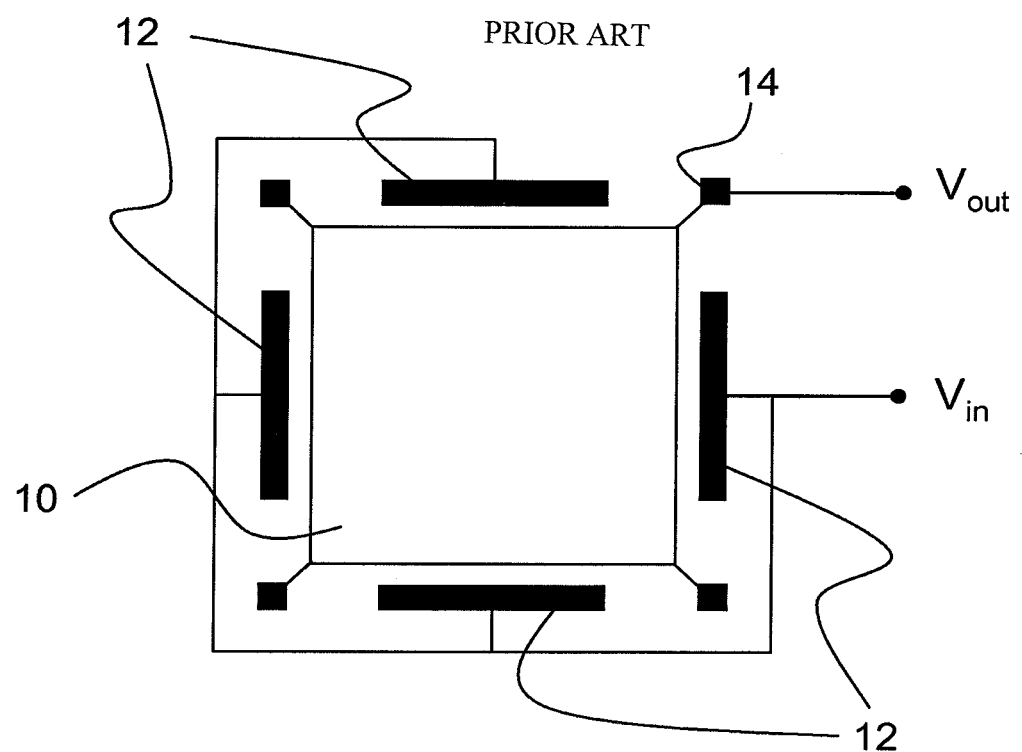
FIG. 1 shows a rudimentary known MEMS resonator apparatus.

It should be noted that these figures are diagrammatic and not drawn to scale. Relative dimensions and proportions of parts of these figures have been shown exaggerated or reduced in size, for the sake of clarity and convenience in the drawings.

FIG. 1 shows a typical square MEMS resonator apparatus according to the prior art. The resonator 10 is suspended between a set of electrodes 12. In the example pictured, the electrodes are all actuation electrodes applying an input signal $V_{in}$ to the resonator 10. In this case, the resonator is suspended at its corners. Output measurement is achieved using connection contact 14 at one corner, which is electrically connected to the bulk of the resonator. Application of an input signal $V_{in}$ to the electrodes 12 exerts electrostatic force on the resonator plate 10. At the same time, the electrodes and plate form a capacitor. Any movement of the plate relative to the electrodes will change the capacitance across the gap. This is precisely what occurs at resonance—the electrostatic forces generated by the AC input signal generate a resonance of the mechanical structure. This results in a capacitance change, which produces an output voltage $V_{out}$ which is directly related to the time-varying capacitance.

MEMS devices can be fabricated in isotropic materials such as poly-crystalline silicon (poly-silicon) and diamond, or anisotropic materials such as single-crystal silicon and gallium arsenide. The latter two examples are both characterised by a cubic crystal lattice structure.

In isotropic materials, the elastic modulus is independent of direction in the material. In other words, the material is equally "rigid" in every direction. In anisotropic materials, by contrast, the modulus is dependent on direction in the crystal lattice.

Analysis of the square resonator of FIG. 1—whether fabricated from isotropic or anisotropic semiconductor material—has shown that resonant extensional mode vibrations result in distortion of the square shape. As a result, the displacement of the peripheral edge of the plate is found to be non-uniform.

To consider the effect of non-uniform displacements along the edge of the resonator, the shape of the actuation electrodes must be taken into account. These are separated from the resonator by a gap g. The manufacturing process imposes a minimum size on g—usually related to limitations of the lithography. It is generally advantageous to choose g to be as close as possible to the minimum value, because this maximizes the electrostatic actuation force and maximizes the output current. In other words, it minimizes the motional resistance of the resonator Rm which is proportional to $g^4$.

Figure 2:
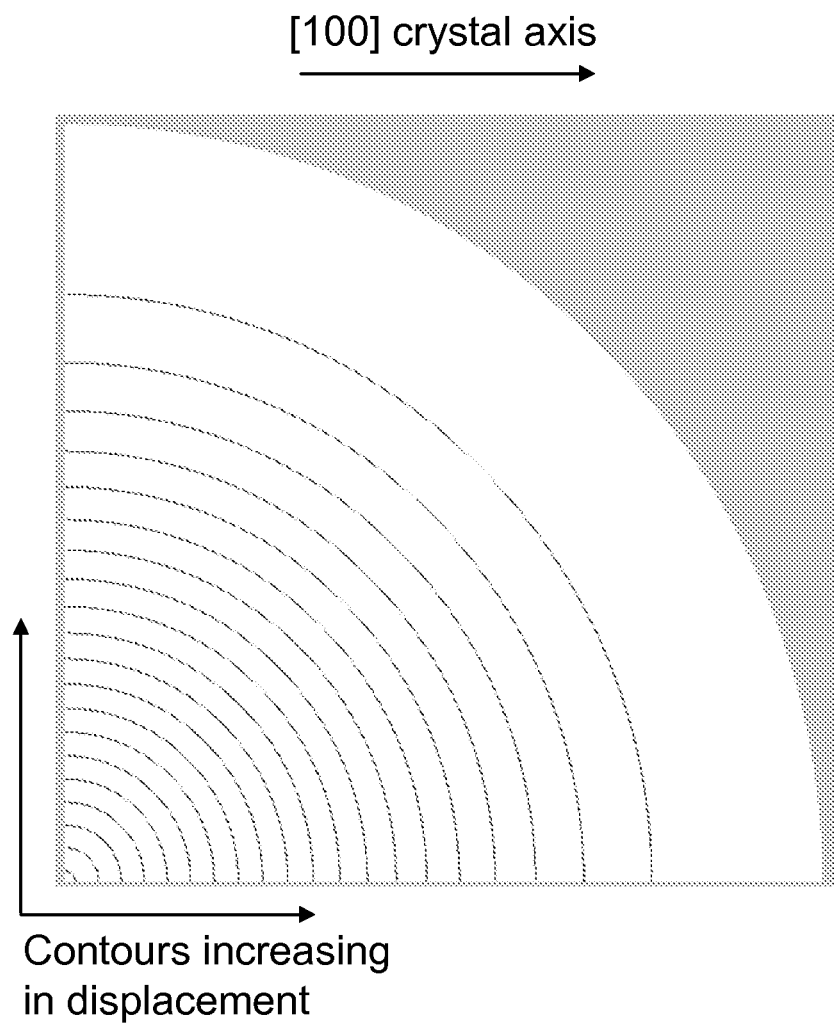
FIG. 2 shows the mode-shape of a disk resonator in isotropic silicon.

For isotropic materials, the asymmetric deformation of the resonator can be overcome by fabricating a disk (circular) resonator instead of a square plate. It can be shown by analysis that the circle expands (and contracts) uniformly, resulting in uniform displacement around the circumference. This is illustrated in FIG. 2, in which the curved lines are contours of equal cumulative displacement. Only one quadrant of the disk is shown, with the [100] direction in the crystal lattice corresponding to the horizontal axis in the drawing.

Figure 3:
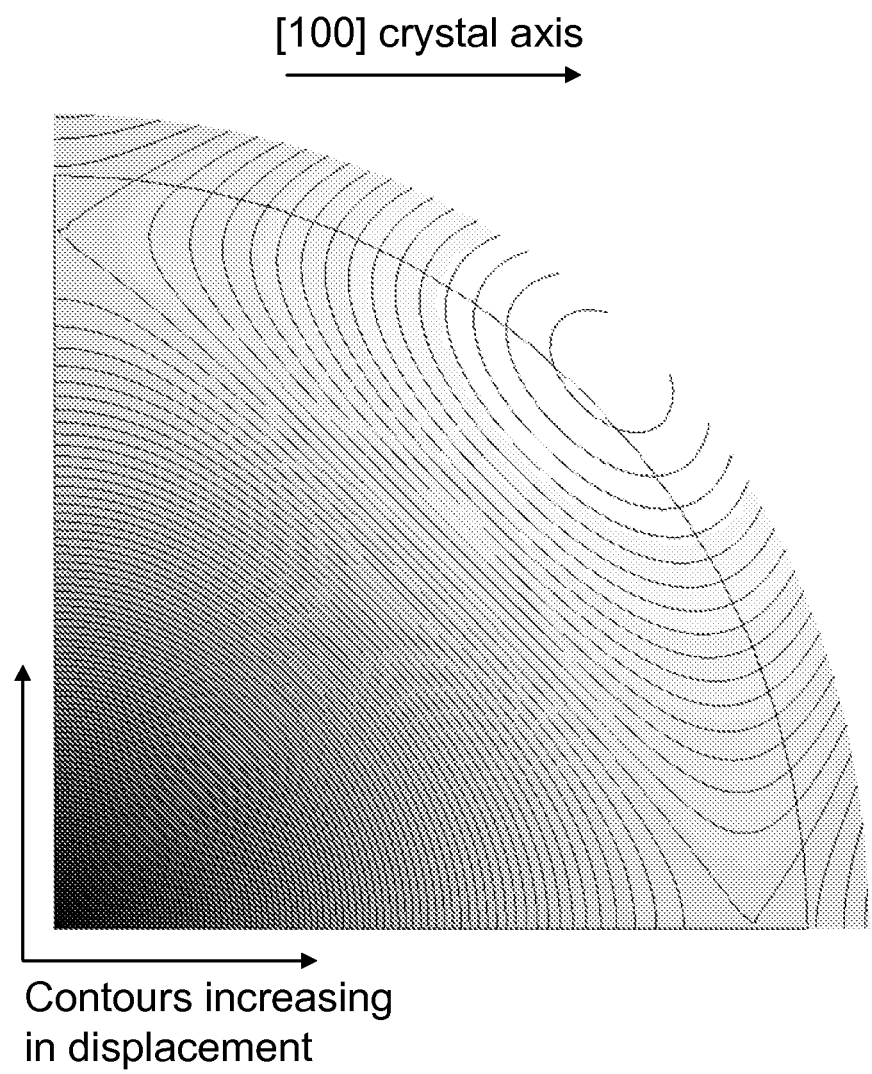
FIG. 3 shows the mode-shape of a disk resonator in anisotropic silicon.
Figure 4:
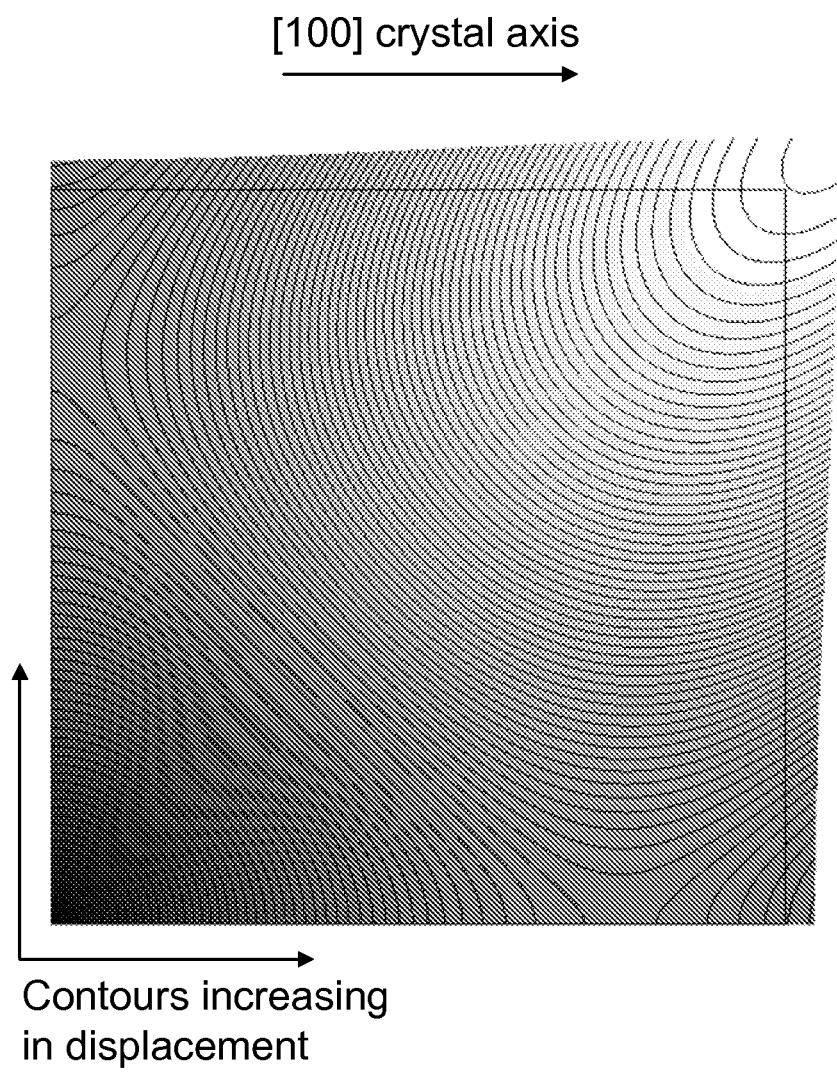
FIG. 4 shows the mode-shape of a square resonator in anisotropic silicon.
Figure 5:
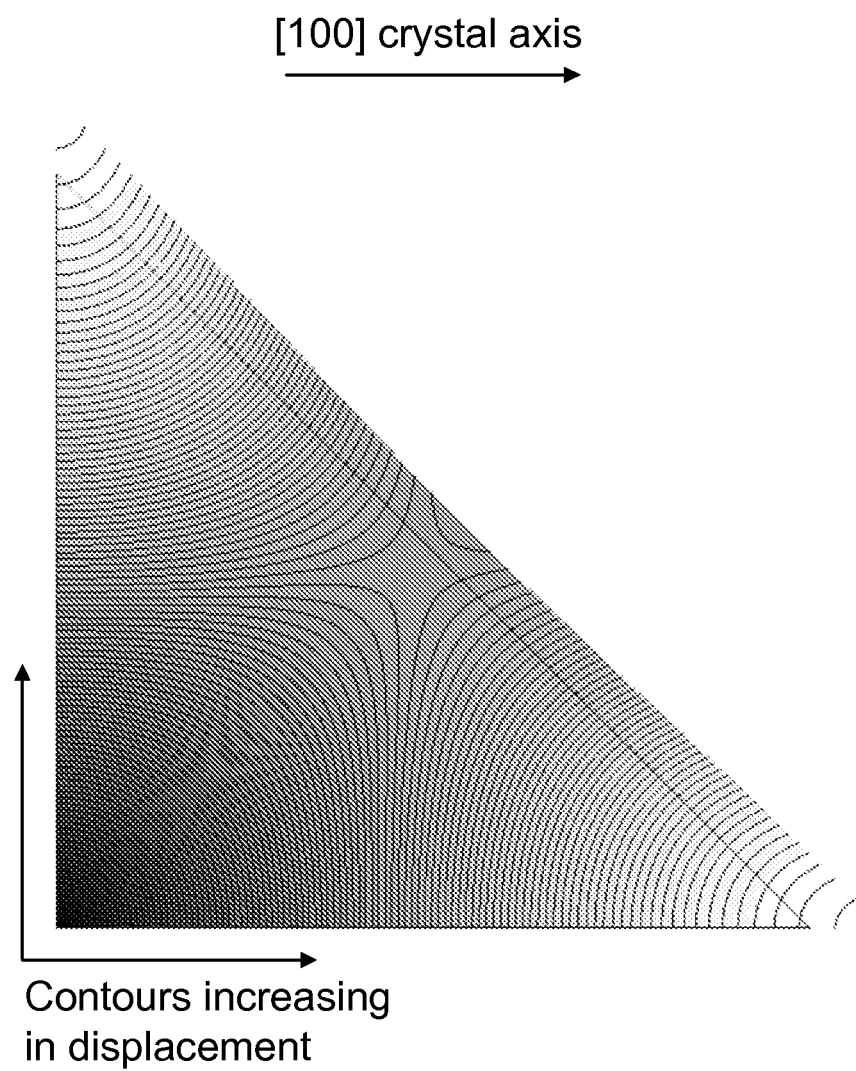
FIG. 5 shows the mode-shape of a triangular resonator in anisotropic silicon.

FIG. 3 shows the mode shape for a similar disk-resonator formed from anisotropic silicon. The use of anisotropic material reintroduces the undesirable non-uniform displacement of the peripheral edge. FIGS. 4 and 5 illustrate the same effect for different resonator geometries. FIG. 4 shows the mode shape of a square resonator in anisotropic silicon, while FIG. 5 shows the same for a triangular resonator. In each of FIGS. 3 to 5, the contour-lines are lines of equal displacement. There are 100 of these contours, which are equally spaced. Thus the difference in displacement between two contours is 1% of the maximum displacement. The number of lines intersecting the peripheral edge of each resonator in these drawings is an indication of the non-uniformity of the extension of the edge at resonance.

The non-uniformity of edge-displacement at resonance has a number of disadvantages. The onset of non-linearity moves to a lower power level than would be observed for the case of uniform displacement. This happens because the edge of the resonator approaches the electrodes at some points more quickly than others. Contact between electrodes and resonator is not necessary to precipitate non-linearity. Indeed, non-linearity can be observed much sooner, when the maximum displacement around the edge is less than one third of the original gap.

A second disadvantage is the increased likelihood of exciting other, unwanted modes of resonance. This occurs because the shape of the electrodes is not well matched to the desired mode.

A related effect is that the efficiency of excitation of the desired mode is reduced. Force is maximised at locations of maximum excitation of the edge; therefore, non-uniform displacement means that force is maximal around only part of the edge, reducing the overall excitation (as well as detection) efficiency.

These disadvantages of the circular resonator conflict with the intrinsic advantages of anisotropic crystals. They usually have better mechanical properties than isotropic materials, resulting in lower intrinsic energy loss and hence a higher Q-factor. Single crystal silicon also benefits from independence to various process parameters during manufacture.

To provide the advantages of anisotropic materials while mitigating the problems associated with non-uniform displacement in extensional mode resonance, the current inventors have developed an optimised geometry resonator. In particular, they have deduced that it is possible to shape a resonator so that edge displacement at resonance is uniform, despite the anisotropy of the material used.

Figure 6:
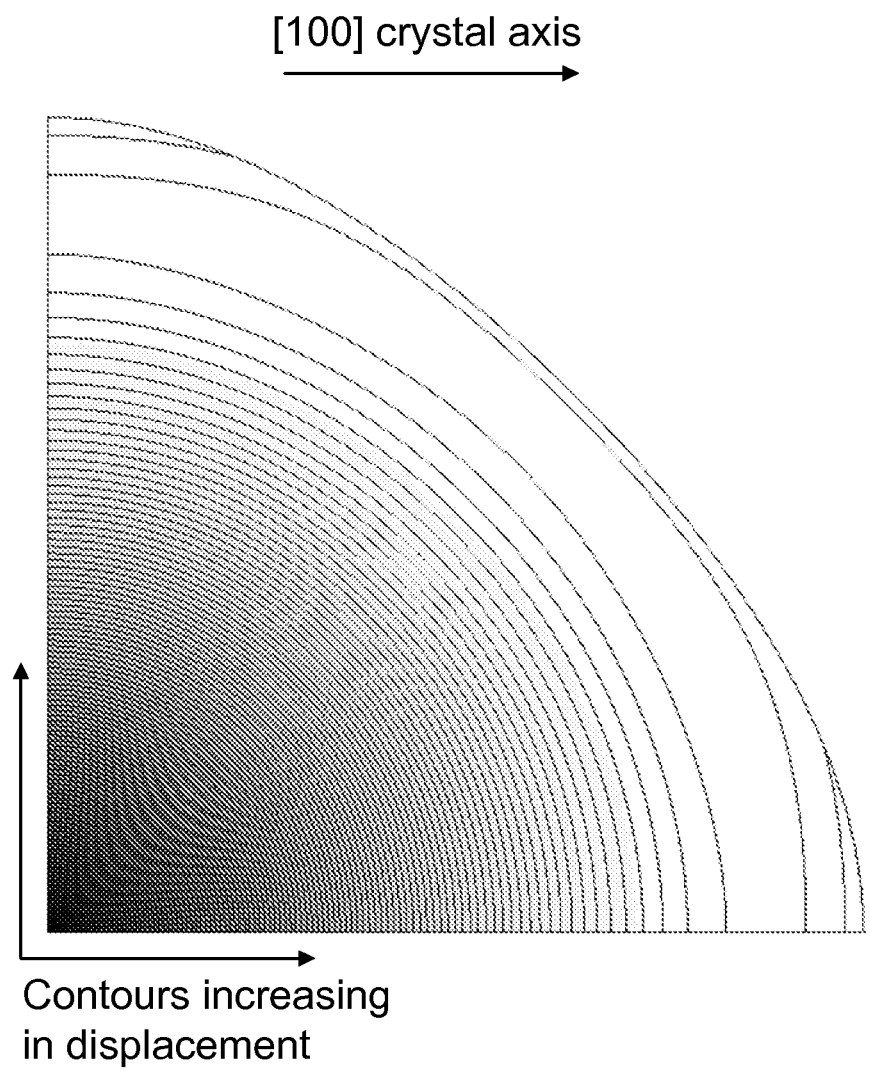
FIG. 6 shows the mode-shape of a resonator made of anisotropic silicon, having an optimised shape according to an embodiment.

According to the optimised geometry, the shape of resonator depends on the directional properties of the material from which it is fabricated. More specifically, the simple disk shape of FIGS. 2 and 3 is modified, taking into account the anisotropic elasticity of the medium. FIG. 6 illustrates an example of the mode shape of the optimised resonator in anisotropic silicon. Once again, each successive contour corresponds to 1% of the maximum displacement. As can be seen from FIG. 6, for a resonator having the optimised shape, only one of these contours intersects the boundary of the resonator. This shows that the displacement variation at the edge of the resonator is less than 2%. Comparing FIG. 6 with FIGS. 3 to 5, the improvement compared to regular (circular, square, triangular) shapes is readily apparent.

The optimal shape of FIG. 6 has a smaller diameter (or radius) in directions in which the material is stiffer and a larger radius in directions in which the material is more pliable. The "stiffness" is determined by the modulus of elasticity, which for anisotropic materials is expressed as a matrix. For cubic crystals, this elasticity matrix has the form:

$$C = \begin{bmatrix} c_{11} & c_{12} & c_{12} & 0 & 0 & 0 \\ c_{12} & c_{11} & c_{12} & 0 & 0 & 0 \\ c_{12} & c_{12} & c_{11} & 0 & 0 & 0 \\ 0 & 0 & 0 & c_{44} & 0 & 0 \\ 0 & 0 & 0 & 0 & c_{44} & 0 \\ 0 & 0 & 0 & 0 & 0 & c_{44} \end{bmatrix}$$

For silicon, for example, the coefficients are approximately $c_{11}$=166 GPa, $c_{12}$=64 GPa and $c_{44}$=80 GPa.

The optimised shape may be determined analytically as the slowness surface of quasi-longitudinal waves in the medium. The slowness surface $f(\phi)$ is the inverse of the phase velocity of the acoustic waves:

$$f(\phi) = \frac{1}{V_p} = \frac{k}{\omega}$$

Here, k is the wave number and $\omega$ the angular frequency of the acoustic wave. Phase velocity varies as a function of propagation direction, so the slowness surface, expressed as distance from a point of origin, varies with angle.

For quasi-longitudinal waves in anisotropic materials with a cubic crystal structure, the slowness in the (010) plane is a slowness-line given by:

$$f(\phi)=1/V_p(\phi)=k/\omega=(2\rho)^{1/2}\{c_{11}+c_{44}+\sqrt{(c_{11}-c^{44})^2\cos^2 2\phi+(c_{12}+c_{44})^2\sin^2 2\phi}\}^{-1/2}$$

Here $\rho$ is the density of the material and $\phi$ is the direction of propagation in the (010) plane. Silicon, for example has a density of approximately 2330 kg/m$^3$. Techniques for calculating the slowness surface for various other crystal structures and planes of propagation are given in (Auld, B. A., "Acoustic waves in solids", 1973, Wiley-Interscience). The slowness surfaces for more complex materials can be derived using numerical methods.

Figure 7:
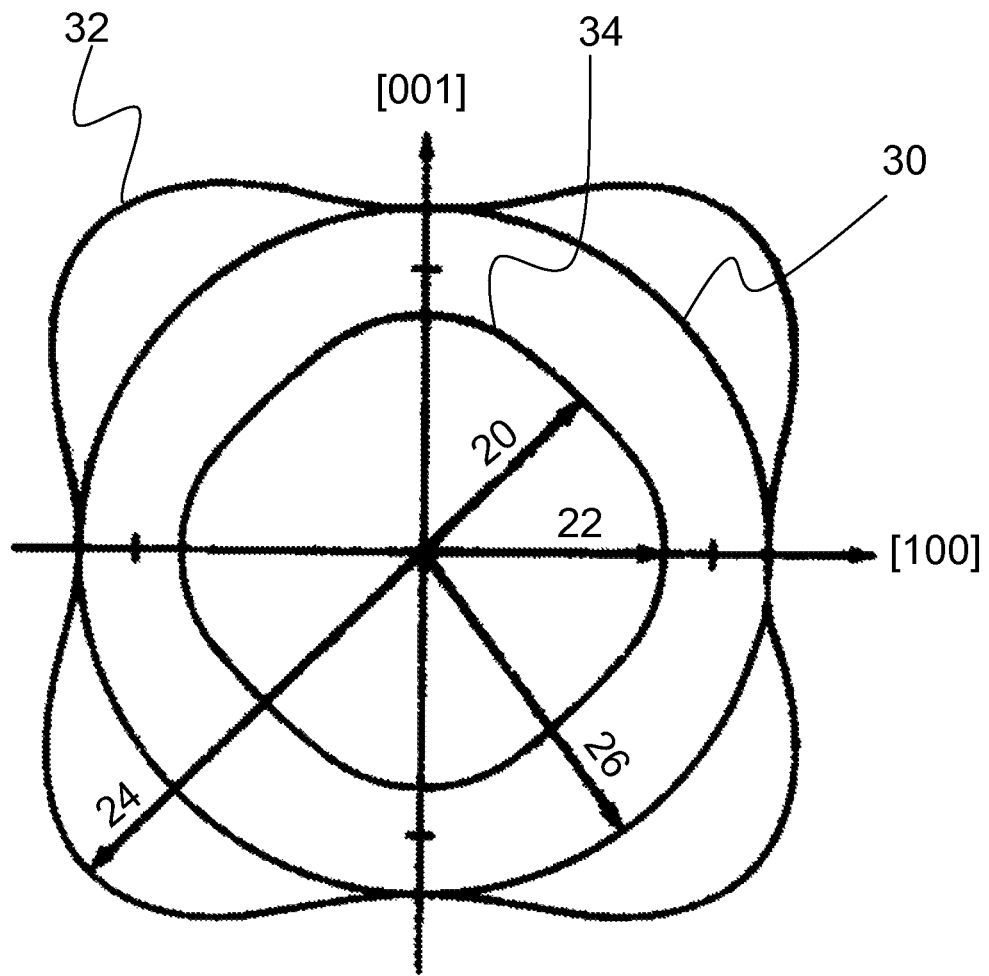
FIG. 7 shows slowness surfaces for anisotropic cubic crystalline material.

FIG. 7 shows an example of slowness surfaces of a cubic anisotropic material for waves propagating in the (010) plane in a polar plot (the distance from the origin represents the value of the slowness in a particular direction). In this plot, the contour 34 is the slowness surface of interest—that of quasi-longitudinal waves. The other lines relate to other resonance modes: 32 being the slowness surface for a quasi-shear mode and 30 being for pure shear, [010]-polarised waves. Each slowness line is characterised by one or more radii 20, 22, 24, 26. For the quasi-longitudinal slowness line 34, the radius 22 in the [100] direction ($\phi$=0) is greater than the radius 20 at an angle $\phi$ of 45 degrees, as expected based on the coefficients of the elasticity matrix for silicon. The expressions for these radii are as follows:

$$f(0) = \sqrt{\frac{\rho}{c_{11}}}$$

$$f\left(\frac{\pi}{4}\right) = \sqrt{\frac{\rho}{c_{11} + c_{44}\left(1 - \frac{1}{A}\right)}}$$

A is an anisotropy factor:

$$A = \frac{2c_{44}}{c_{11} - c_{12}}$$

The dimensions of the slowness surface (or line) are those of time over distance—that is, it is measured in seconds per meter. The actual physical dimensions of a resonator designed according to this shape will be scaled as appropriate to select the desired frequency. It can be shown that the energy flow velocity (also known as group velocity) direction for acoustic waves is perpendicular to the slowness surface. When the acoustic velocity is anisotropic the exact calculation is difficult and can require numerical approximations.

Figure 8:
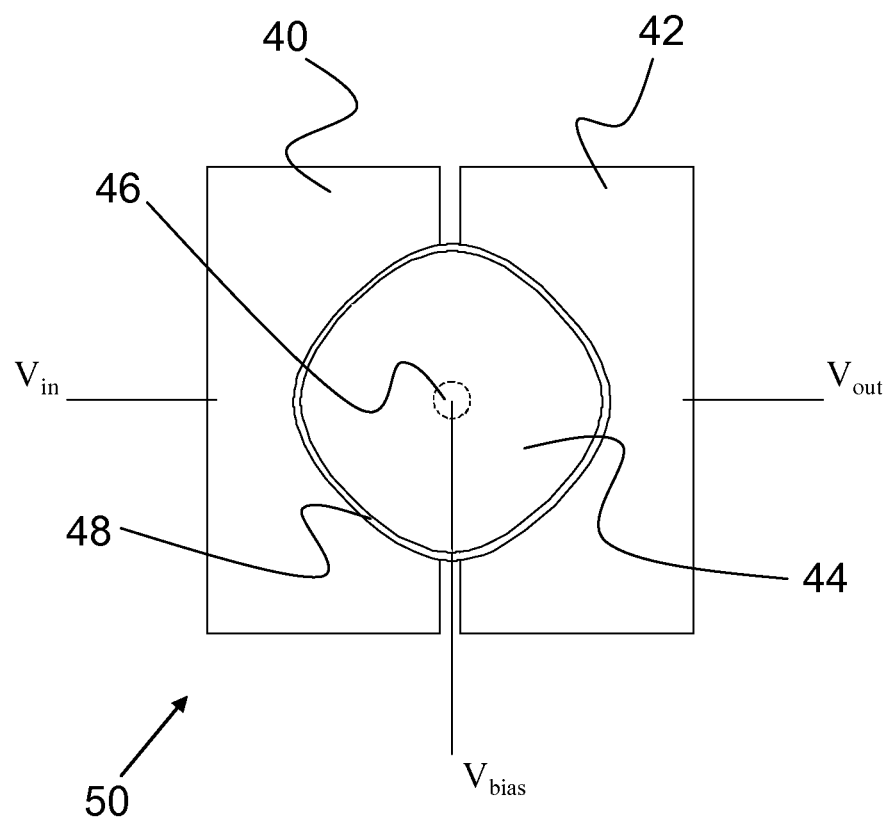
FIG. 8 is a diagram of an embodiment of a MEMS resonator having a shape corresponding to its slowness surface.

FIG. 8 shows plan view of a resonator apparatus 50 utilising a MEMS resonator 44 with a shape proportional to its slowness surface. The resonator 44 is freely suspended on a stem 46, via which it is electrically biased with a bias voltage $V_{bias}$. The stem gives the resonator a "mushroom"-like structure. The resonator 44 is situated between two electrodes—an actuation electrode 40 and a detection electrode 42. An input voltage $V_{in}$ is applied to input electrode 40 and an output voltage $V_{out}$ is measured from output electrode 42. The electrodes 40 and 42 are separated from the resonator 44 by a gap 48 of constant width. As discussed above, the gap can be minimised (subject to process limitations in fabrication) so as to maximise the electrostatic force applied by the electrodes all around the perimeter of the resonator. This is made possible because the displacement of the edge in the quasi-longitudinal resonance mode is uniform around the boundary. In other words, at resonance, the elastic deformation of the resonator is such that every point around its peripheral edge is displaced by a near-identical distance transverse to the edge.

Without wishing to be bound to any particular theory, an intuitive explanation of the physics of the device pictured in FIG. 8 is as follows.

For resonance in the extensional mode, the mode shape consists mainly of standing (quasi)-longitudinal acoustic waves, which travel radially through the resonator. At resonance the mode shape consists of a superposition of standing waves with the same frequency traveling in different directions with different phase velocities through the resonator. Since these are standing waves, each outward traveling wave has an inward traveling counterpart with opposite speed. Each wave needs to be reflected (that is, have its speed reversed) upon "impact" with the edge of the resonator. If the momentum-flux density of the wave is p, the pressure needed to reverse the wave is proportional to dp/dt. It can be shown that the energy flow velocity direction of acoustic waves is always perpendicular to the slowness surface of the wave and the momentum-flux density will have the same direction as the energy flow direction.

Therefore, the pressure on the edge of the resonator by the momentum-flux of an acoustic wave emanating from its center will only be perpendicular to the edge if the edge has the same shape as the slowness surface of the material. However, the pressure by acoustic waves on the edge of the resonator can only be perpendicular everywhere along the edge if the displacement of the edge is approximately constant along the perimeter. The validity of the assumptions made in this argument can be shown by a finite element calculation for an anisotropic silicon resonator with the shape of its slowness surface.

Micro-machining techniques for the fabrication of MEMS resonators are known. A typical process might comprise fabrication in silicon by etching trenches in a SOI wafer substrate. Methods for deposition of semiconductor and conductor layers, photo-lithography to pattern the devices and etching to remove material would all be well known to one skilled in the art. A MEMS device according to an embodiment of the invention can therefore be manufactured by choosing a resonator shape suitable for uniform-displacement extensional-mode resonance (as described above) followed by manufacturing using known approaches.

The invention has been described with reference to cubic crystalline materials commonly used in the fields MEMS and semi-conductors chips, such as single crystal silicon and gallium arsenide. However, the scope of the invention is not limited to such materials—rather it is applicable to any suitable anisotropic material, including piezoelectric materials.

The invention has been described with reference to solid resonators. However, it is also possible to design and fabricate resonators with patterns of small holes or thickness variations. Such features can modify the effective material parameters, including the elasticity, and can therefore change the slowness surface compared to a solid resonator of the same shape. In this case the perimeter should be given the shape which corresponds to the modified slowness surface. Various other modifications will be apparent to those skilled in the art.

The invention claimed is:

1. A micro-electromechanical resonator comprising:
   a material having anisotropic directional elasticity characteristics, wherein
   a shape of the resonator is such that a first distance in a first direction from a centroid of the resonator to a first point on a peripheral edge of the resonator is greater than a second distance in a second direction from the centroid to a second different point on the edge, and
   for every first direction and every second direction wherein the material has a lesser modulus of elasticity in the first direction than the second direction.

2. The resonator of claim 1, wherein
   the shape is adapted in accordance with the directional characteristics to provide resonance in a predetermined extensional resonance mode,
   the resonance mode producing an elastic deformation of the resonator which displaces the peripheral edge of the resonator, and
   the displacement being substantially uniform at every point along a perimeter around the edge in the direction perpendicular to the edge at each point.

3. The resonator of claim 2, wherein the predetermined extensional resonance mode is a quasi-longitudinal mode.

4. The resonator of claim 3, wherein the shape is proportional to a slowness surface of the material, corresponding to the quasi-longitudinal mode.

5. The resonator of claim 1, wherein the distance from the centroid to the peripheral edge is greatest and the modulus of elasticity is least in the direction of a crystal lattice of the resonator.

6. The resonator of claim 1, further comprising a supporting stem attached to the centroid.

7. The resonator of claim 6, wherein the resonator is biased by a bias voltage applied via the stem.

8. A micro-electromechanical system comprising:
   a substrate;
   an input electrode and an output electrode on the substrate; and
   the micro-electromechanical resonator of claim 1 suspended above the substrate between the input and output electrodes.

9. The micro-electromechanical system of claim 8, wherein the input and output electrodes are shaped so as to cooperate with the resonator to form an actuation gap between each electrode and the peripheral edge of the resonator, wherein the gap is of a substantially uniform width at every point around the edge in the direction perpendicular to the edge at each point, and the width is sufficient to accommodate displacement of the edge in a predetermined extensional resonance mode in which the resonator provides resonance, without the electrodes contacting the resonator.

10. A method of manufacturing a micro-electromechanical resonator, the resonator including a material having anisotropic directional elasticity characteristics, the method comprising:

selecting a shape of the resonator such that a first distance in a first direction from a centroid of the resonator to a first point on a peripheral edge of the resonator is greater than a second distance in a second direction from the centroid to a second different point on the edge for every first direction and every second direction wherein the material has a lesser modulus of elasticity in the first direction than the second direction; and producing the resonator having the selected shape.

11. The method of claim 10, wherein selecting a shape includes selecting a shape of the resonator to provide a predetermined quasi-longitudinal extensional resonance mode.

12. The method of claim 11, wherein the step of selecting the shape comprises:

choosing a shape proportional to a slowness surface of the material, corresponding to the quasi-longitudinal mode.

13. A resonator apparatus comprising:

a first portion of a material having anisotropic directional elasticity characteristics, the first portion extending to a first point on a peripheral edge of the resonator apparatus that is a first distance in a first direction from a centroid of the resonator apparatus; and a second portion of the material extending to a second different point on the peripheral edge that is a second distance in a second direction from the centroid, the first distance being greater than the second distance, the material having a lower modulus of elasticity in the first direction than in the second direction.

14. The apparatus of claim 13, wherein the material is configured and arranged to exhibit uniform elastic expansion and contraction at the peripheral edge.

15. The apparatus of claim 13, further including an anchor connected between the centroid and a substrate, the portions of the material not connected to the anchor being freely suspended over the substrate.

* * * * *